United States Patent [19]
Davidsohn, deceased et al.
[11] 3,813,584
[45] May 28, 1974

[54] SOLID STATE INTEGRATED CIRCUITS

[76] Inventors: Uryon S. Davidsohn, deceased, late of Scottsdale, Ariz.; Amil J. Ajamie, administrator, 3550 N. Central, 705, Phoenix, Ariz. 85012; John P. Short, 207 Marion; Clyde Combs, Jr., 499 Cinnamon Dr., both of Satellite Beach, Fla. 32937; Edward E. Guerra, 1983 Downing Ct., Santa Clara, Calif. 95051

[22] Filed: Oct. 10, 1972

[21] Appl. No.: 296,346

Related U.S. Application Data

[62] Division of Ser. No. 374,132, June 10, 1964, abandoned.

[52] U.S. Cl......... 317/235 D, 317/235 R, 317/235 F
[51] Int. Cl. .......................................... H01l 19/00
[58] Field of Search.......... 317/235 B, 235 D, 235 F

[56] References Cited

OTHER PUBLICATIONS

Electronic Design, "Silicon I.C's Steal The Show", Vol. 12, No. 8, April 13, 1964, p. 12.
Electronics Review, "Microelectronics", Vol. 37, No. 17, June 1, 1964, p. 23.

*Primary Examiner*—Rudolph V. Rolinec
*Assistant Examiner*—Joseph E. Clawson, Jr.

[57] ABSTRACT

A dielectrically isolated integrated circuit containing at least one polycrystalline resistor between and dielectrically isolated from adjacent single crystal semiconductor islands.

8 Claims, 9 Drawing Figures

PATENTED MAY 28 1974 3,813,584

SOLID STATE INTEGRATED CIRCUITS

CROSS-REFERENCE TO RELATED APPLICATIONS

This application is a division of applicants' copending prior application Ser. No. 374,132, filed June 10, 1964, now abandoned.

This invention relates to solid state integrated circuits and more particularly to a process for improving the electrical isolation between components of such circuits.

Present day emphasis upon microminiaturization of electronic circuitry has resulted in the development of a number of techniques for fabricating solid state integrated circuits. However, severe limitations in the use of such circuits have been presented by the heretofore insufficient electrical isolation between components and between components and substrate thereof. Specifically, the high frequency response of prior art solid state integrated circuits has been severely limited by the relatively high capacitances between components and substrate and between components themselves. In addition, relatively high leakage currents between components and relatively low breakdown voltages of presently used isolation barriers have resulted in inferior circuit operation compared to that of non-integrated circuits and, in some cases, in eventual destruction of the integrated circuit.

A known method of electrically isolating components in a solid state integrated circuit is that of incorporating internal p-n junctions between components thereof. These junctions are generally provided in pairs in back-to-back relationship, although in some known structures a larger number of p-n junctions are incorporated in series between the components. The junctions may be back-biased or relatively unbiased. In any event, a p-n junction is, as is well known, extremely sensitive to temperature; the reverse, or leakage, current therethrough increasing exponentially with increasing temperature. Because this effect is cumulative, i.e. increase in temperature of the junction resulting in increase in leakage current therethrough causing further increase in junction temperature, and so forth, the eventual result of subjecting a p-n junction to temperature extremes is self-destruction of the junction. An additive effect on this deleterious operation is the generally relatively low breakdown voltage of the p-n junction. Thus, if the junction is heavily back-biased, which may occur with changes in biasing of the integrated circuit components, the well known avalanche effect may follow in which minority carriers are attracted across the junction in increasingly large numbers with eventual junction destruction.

Another extremely severe limitation on the use of integrated circuits employing p-n junctions as isolation barriers is that such junctions are characterized by capacitance values which seriously reduce high frequency response of the overall circuit. That is, the high frequency response characteristics of an integrated circuit are limited by the magnitude of shunt capacitance from component to substrate or between components, the response decreasing rapidly with increasing capacitance, and p-n junctions having relatively high capacitance.

In accordance with a preferred embodiment of the present invention a heavily doped semiconducting layer is deposited on one surface of a monocrystalline semiconductor, preferably, but not limited to, silicon. The wafer thus formed is suitably grooved in accordance with a pattern determined by the desired final circuit configuration, after which a coating of electrically isolating material is formed on or applied to the grooved surface area including the surfaces of the grooves. A relatively thick substrate layer is then deposited on the coated surfaces, and the entire wafer is flattened. The surface of the single crystal opposite said one surface is abrasively polished until the substrate is exposed, the polishing having removed relatively even layers of said opposite surface to produce a plurality of semiconductor islands separated by isolating barriers and substrate. Thus a solid state block is provided in which the final circuit component configuration may be fabricated by conventional techniques to produce any desired integrated electronic circuit. The isolating material is such that capacitance between islands and substrate and leakage current between islands are substantially reduced, and that breakdown voltage between islands is substantially increased over previously used isolation barriers, particularly of the p-n junction type.

It is therefore a broad object of the present invention to provide an improved isolation barrier between components of solid state integrated circuits.

It is another broad object of the present invention to provide a process for improving electrical isolation of components in solid state integrated circuits.

It is a further object of the present invention to provide a process for improving electrical isolation between components of solid state integrated circuits such that the process may be incorporated as the first portion of the overall process of manufacture of such integrated circuits.

It is a more specific object of the present invention to provide a simple and efficient process for improving electrical isolation of components in solid state integrated circuits whereby the high frequency response characteristics of such circuits are improved.

It is a still further object of the present invention to improve electrical isolation of components in solid state integrated circuits to improve the voltage breakdown and leakage current characteristics of such circuits.

It is another object of the present invention to provide a method for improving electrical isolation of solid state integrated circuit components which combines positive and reliable isolation with simplification of production of the final overall circuit.

Further objects, features, and attendant advantages of the present invention will become apparent from a consideration of the following specification taken in conjunction with the accompanying drawings, in which.

Figure 1:
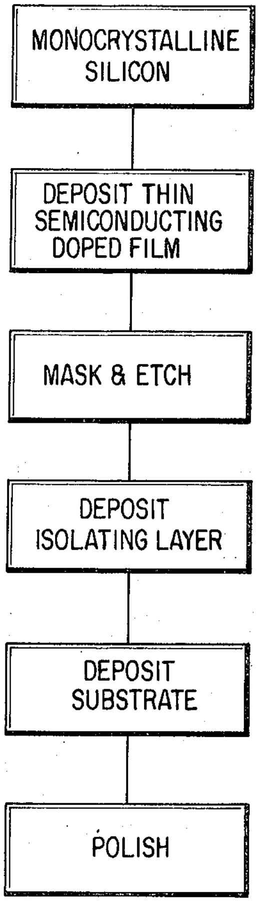
FIG. 1 is a diagram representing a preferred series of steps of a process in accordance with the present invention.
Figure 4:
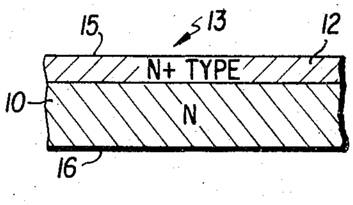

Referring now more particularly to the drawings, in which like reference numerals have been used to refer to like components, FIG. 1 is a diagrammatic representation of a preferred sequence of steps of a process in accordance with the present invention. Reference is also made to FIGS. 3 to 8 as the process of FIG. 1 is described. A single crystal 10 of, for example, n-type silicon is preferably used as the beginning component in the process. Any of the various conventional methods of producing such a monocrystalline form may be used, as desired. A thin film 12 of heavily doped semiconducting material, for example, n-type silicon, is epitaxially deposited on a surface 11 of the single crystal 10 as shown in FIG. 4. Preferably the latter step is effected by epitaxial deposition of silicon using hydrogen reduction of silicon tetrachloride appropriately doped with n-type (donor) impurities, but it may alternatively be accomplished by other conventional techniques, as, for example, vapor or vacuum deposition of the film 12. It is to be understood that each individual step of the process of the present invention may readily be accomplished by well-known techniques, and that specific techniques described therefor are by way of illustration only. That is, the novelty of the process resides in the particular combination of steps employed therein.

Figure 5:
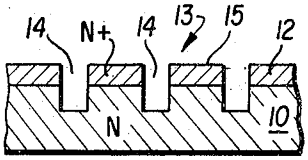

The wafer 13 thus produced may be suitably masked, for example by the known photo-resist technique, in accordance with the pattern of the desired final integrated circuit configuration, and then etched to produce grooves or channels 14 extending through the heavily doped layer 12 and into the single crystal 10 to a desired depth between the exposed surface 15 of layer 12 and surface 16 of crystal 10 (FIG. 5). It is to be emphasized that FIGS. 3 to 9 are exaggerated views of the progress of the wafer as the individual process steps are performed, and that such characteristics as shape or dimensions of layers or films and of channels, in addition to the illustrated representation of and dimensions of the wafer, are for purposes of convenience and clarity only, and are not to be considered as imposing restrictions or limitations on the process or materials treated thereby. Such parameters as the dimensions of the channels 14, as well as the particular shape and intersections thereof, are selected in accordance with the desired final integrated circuit.

Grooving of the wafer 13 may alternatively be accomplished by scribing or sawing thereof. By way of illustration of the preferred photoresist and etching techniques mentioned above, however, the following technique may be employed. The surface 15 is coated with a photoresistant film sensitive to radiation, for example ultra-violet light. A photographic mask of a pattern consonant with the desired circuit configuration is superposed on the coated surface which is then exposed to radiation. The pattern appearing on the coated surface is then developed to remove those portions of the photoresistant coating unexposed to the radiation, leaving surface areas of photoresistive coating. Those portions unprotected by photoresistive material are then suitably etched to the desired depth by use of, for example, a fluoride etchant solution that dissolves silicon to provide channels 14. The remaining photoresistive coating may then be removed by any desired technique.

Figure 6:
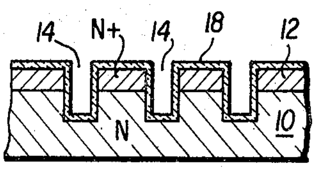

The surfaces of the "moats" or channels 14 and the exposed surface area 15 therebetween are then coated with an electrical isolation layer 18, as in FIG. 6, by any desired technique. A preferred but non-limiting technique is that of subjecting the wafer to extremely high temperatures, below the melting point of the wafer component structure involved, in a controlled oxidizing atmosphere of air, oxygen, or steam, for example, to thereby form a hard silicon dioxide coating several thousand angstroms in thickness. While a silicon dioxide layer is preferred and is employed as the isolating material in this exemplary embodiment, it is to be understood that other isolation coatings such as silicon monoxide or ceramic substrates, for example, may be utilized if desired.

Figure 7:
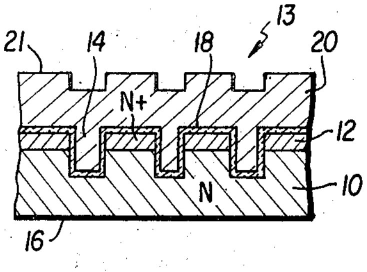
Figure 8:
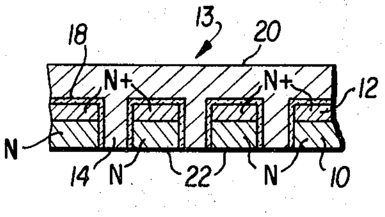

Following the formation of deposition of isolating coating 18 a relatively thick layer of polycrystalline substrate 20, having a high resistivity, is deposited thereon (FIG. 7). The substrate 20 may be epitaxially deposited, for example, using hydrogen reduction of silicon tetrachloride at elevated temperatures. Alternatively, the substrate 20 may be deposited by dipping the slice in molten silicon. Other conventional techniques of deposition may also be employed. The substrate 20 is sufficiently thickly deposited to fill the voids in channels 14 as shown in FIG. 7, the thickness of substrate layer above surfaces 15 being dependent upon desired final circuit dimensions.

The final step in the wafer fabrication process is that of flattening the entire wafer 13 between the exposed polycrystalline surface 21 and the surface 16 of the original single crystal. The surface 16 is then polished by any conventional technique, for example, by the use of very fine abrasives, to evenly remove layers therefrom until the polycrystalline substrate 20 is exposed in the moats or channels 14 between component islands 22. The exemplary wafer fabricated by the process of FIG. 1 is illustrated in cross section in FIG. 8. This wafer structure is then further processed for fabrication of the final solid state integrated circuit in accordance with the particular requirements of the desired circuit, and with conventional techniques.

Figure 9:
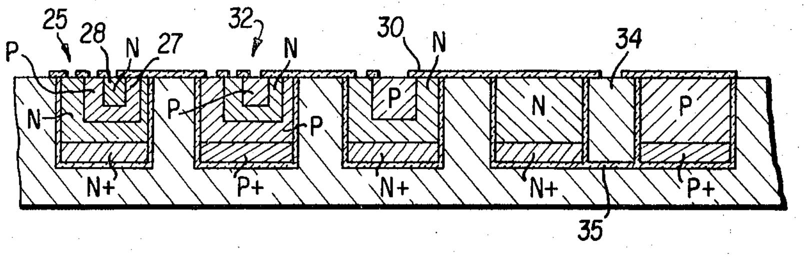
FIG. 9 is one embodiment of a completed solid state integrated circuit fabricated from the wafer of FIG. 2.

Thus, for example, the islands 22, and the substrate therebetween, of the wafer 13 may be used for the fabrication of npn transistors, pnp transistors, capacitors, resistors, diodes, or multi-layer devices (FIG. 9). For purposes of illustration, npn transistors, such as 25, may be fabricated by masking the wafer to provide windows therethrough over the selected islands and diffusing, for example, p-type impurities (acceptor impurities) transversely through the windows into island material to the depth and lateral extension desired, as at 27. The islands may then be remasked and n-type impurities dispersed therein as desired, as at 28. Each component or set of components may be formed by similar conventional techniques, after which the component islands may be coated with a suitable isolating surface layer 30, for example silicon oxide, with provision made therein for applying contacts. It is to be understood that in fabricating the final integrated circuit structure several islands in the overall block which are to have the same or similar components may be processed at the same time by suitably masking, and performing the desired steps. Capacitors, resistors, diodes, multi layer, and other devices may be produced in or between the component islands by similar known techniques.

Figure 2:
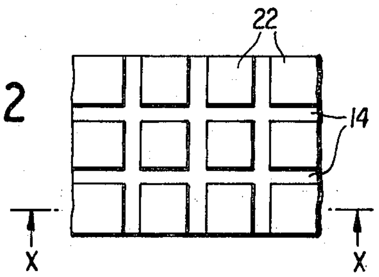
FIG. 2 is a plan view of one embodiment of a solid state wafer for an integrated circuit produced in accordance with the process of FIG. 1.
Figure 3:
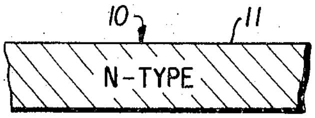
FIGS. 3 through 8 are sectional views taken in the plane $x$—$x$ of FIG. 2 representing the progress of the integrated circuit isolation at each step of the process of FIG. 1.

FIG. 2 is a plan view illustrating the "waffle" wafer structure of the wafer 13 following the steps represented by FIGS. 3 to 8. It is to be realized that the intersecting channels 14 need not follow the particular design illustrated in FIG. 2, for the sake of convenience, but may be provided in any desired configuration. The wafer isolation structure of the present invention is advantageous over p-n junction isolation barriers for the reasons heretofore discussed. Typical comparison values of parameters in the two types of structure are as follows:

| | Preferred Embodiment Wafer Isolation Structure | p-n Junction |
|---|---|---|
| (a) Voltage breakdown between islands | $\geqslant$ 400 volts | <80 volts |
| (b) Capacitance, component to substrate | $\leqslant 5\times10^{-15}f/10^{-3}in.^2$ | $\cong 5\times10^{-13}f/10^{-3}in.^2$ |
| (c) Leakage current between islands | $<10^{-12}$amp | $\cong 10^{-7}$amp |

It may thus be seen that the wafer fabricated by the process of the present invention allows much greater flexibility in solid state integrated circuit design, both in terms of optimizing desirable characteristics of the circuit structure, and of simplicity in fabrication of the finalized circuit structure.

It is again to be emphasized that conventional techniques may be employed in the individual steps of the overall process of the present invention and that the particular techniques which have been described herein are for purposes of illustration only. While there has been described a preferred embodiment of the invention it will be obvious that other embodiments may become apparent to those skilled in the art upon a consideration of the foregoing specification without departing from the true spirit and scope of the present invention. Thus, for example, it will be obvious from the exemplary final integrated circuit structure illustrated in FIG. 9 that rather than depositing a film or layer of doped semiconducting material (as 12 in FIG. 4) on the initial crystal 10, it may be desired to deposit a layer of pure or intrinsic semiconducting material, and then mask the layer and selectively disperse donor and acceptor impurities in separate regions thereof. This, of course, would be performed in accordance with a predetermined pattern for the desired final circuit structure. Alternatively, a layer of impurities, either of a single or of separate-region opposite conductivity types, may be formed by dispersing impurities transversely into the monocrystalline slice 10 to the desired depth and then following the other steps of the process as indicated in FIG. 1 and FIGS. 5–8. Thus, pnp transistors such as 32 (FIG. 9) and other complementary conductivity types of components could readily be incorporated into the final integrated circuit configuration. Further, components such as polycrystalline resistor 34, for example, may be incorporated in the channel or moat region between components in the normal configuration heretofore described. To so incorporate a polycrystalline resistor as 34, the substrate layer 20 may, for example, be etched to a depth extending slightly into a channel region or regions as desired, following the step illustrated in FIG. 7, after which the wafer may be suitably masked and an isolating barrier (as 35, in FIG. 9) applied, as by previously discussed techniques. It is neither practicable nor feasible to include the multitude of variations which may be employed and which do not depart from the spirit and scope of the present invention. It is therefore desired that the invention be limited only by the appended claims.

We claim:

1. An integrated circuit, comprising
a plurality of dielectrically isolated single crystal semiconductor islands in a polycrystalline body,
said islands containing regions of different conductivity type forming complementary semiconductor components in at least some different ones of said islands, and
at least one polycrystalline resistor between adjacent islands and dielectrically isolated from said islands and from said body.

2. The integrated circuit according to claim 1, including
a dielectric passivating layer covering exposed surfaces of said semiconductor components and said polycrystalline resistor, said passivating layer having preselected openings therein to said islands and to said resistor for interconnection thereof.

3. The integrated circuit according to claim 1, wherein
said polycrystalline body and said polycrystalline resistor are composed of silicon.

4. An integrated circuit, comprising
a plurality of dielectrically isolated single crystal semiconductor islands in a polycrystalline body,
semiconductor circuit components formed in said islands, and
at least one polycrystalline resistor between two adjacent islands and electrically isolated from the last-named islands and from said polycrystalline body by a relatively thin uniform layer of dielectric material.

5. The integrated circuit according to claim 4, wherein
said semiconductor islands, said polycrystalline body and said polycrystalline resistor are each composed of silicon.

6. The integrated circuit according to claim 5, wherein
said layer of dielectric material is silicon dioxide.

7. The integrated circuit according to claim 4, wherein
said semiconductor circuit components include complementary junction transistors and junction diodes.

8. A semiconductor integrated circuit, comprising
a substrate,
a plurality of single crystal silicon islands embedded in spaced-apart relation in said substrate at a planar surface thereof, each of said islands having an exposed surface common with said planar surface, said islands dielectrically isolated from each other and from said substrate and having active and passive semiconductor components fabricated therein, and
at least one polycrystalline silicon resistor embedded between two adjacent islands and dielectrically isolated therefrom and from said substrate, for connection in desired electrical circuit configuration with at least some of said active and passive components.

* * * * *